US006396353B1

United States Patent
Kröbel et al.

(10) Patent No.: US 6,396,353 B1
(45) Date of Patent: May 28, 2002

(54) PLL FREQUENCY SYNTHESIZER OPERATED WITH REDUCED SETTLING TIME CONSTANT DURING FREQUENCY CHANGEOVER

(75) Inventors: Hans-Eberhard Kröbel; Richard Stepp, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/606,529

(22) Filed: Jun. 30, 2000

(30) Foreign Application Priority Data

Jun. 30, 1999 (DE) .......................................... 199 30 225

(51) Int. Cl.⁷ .......................... H03L 7/095; H03L 7/107; H03L 7/18
(52) U.S. Cl. .......................... 331/16; 331/1 A; 331/14; 331/17; 331/DIG. 2; 327/156; 327/159
(58) Field of Search .............................. 331/14, 17, 25, 331/DIG. 2, 1 A, 16; 327/156–159

(56) References Cited

U.S. PATENT DOCUMENTS

| 5,128,632 A | | 7/1992 | Erhart et al. ................. 331/1 A |
| 5,302,908 A | * | 4/1994 | Tarusawa et al. .............. 331/25 |
| 5,420,545 A | | 5/1995 | Davis et al. ................... 331/17 |
| 5,631,587 A | | 5/1997 | Co et al. ..................... 327/107 |

FOREIGN PATENT DOCUMENTS

| EP | 0 211 594 A2 | 2/1987 |
| EP | 0 461 358 A1 | 12/1991 |
| EP | 0 582 390 A1 | 2/1994 |
| EP | 0 669 722 A2 | 8/1995 |
| EP | 0 727 877 A2 | 8/1996 |
| JP | 11122101 | 4/1999 |

OTHER PUBLICATIONS

"Les circuits synthetiseurs de frequence pour radiocommunications" Electronique, FR, Cep Communication, Paris, Nr. 83 Jul. 1998.

* cited by examiner

Primary Examiner—David Mis
(74) Attorney, Agent, or Firm—Morrison & Foerster, LLP

(57) ABSTRACT

A PLL synthesizer circuit is disclosed having a programmable divider circuit driven by a controller (microprocessor) for selecting a desired output frequency ($f_{VCO}$) of the PLL synthesizer circuit. An operating mode selector circuit optionally drives a receive operating mode and at least one further operating mode (frequency change operating mode) of the PLL synthesizer circuit. The PLL synthesizer circuit has a smaller settling time constant in the frequency change operating mode. The change into the frequency change operating mode is initiated by a detection of the drive of the programmable divider by means of a changed (new) drive value. The change from the frequency change operating mode into the receive operating mode is caused whenever the phase difference, that is to say the output signal of the phase detector falls below a predetermined threshold value.

22 Claims, 2 Drawing Sheets

PLL FREQUENCY SYNTHESIZER OPERATED WITH REDUCED SETTLING TIME CONSTANT DURING FREQUENCY CHANGEOVER

This application is based on German priority application 19930225.1, which is hereby incorporated in its entirety by reference.

TECHNICAL FIELD OF THE INVENTION

The present invention relates to phase lock loop synthesizer circuits, and more particularly to a PLL synthesizer circuit and a method for operating a PLL synthesizer circuit which improves the frequency change with regard to changing over into the frequency change operating mode and switching back into the receive operating mode.

BACKGROUND OF THE INVENTION

The present invention relates to a method for operating a PLL synthesizer circuit, and to a PLL synthesizer circuit.

PLL synthesizer circuits are well known from the prior art. The principle of such a circuit may be explained with reference to FIG. 3. Starting from the fixed reference frequency of a local oscillator (quartz) 1, selectable output frequencies are to be provided at a voltage-controlled oscillator (VCO) 10. For this purpose, the reference signal of the local oscillator 1 is fed to a programmable reference divider 2, and the divided reference signal is then conducted to a phase detector 3. The phase detector 3 outputs an output signal proportional to the detected difference between the phase of the divided reference signal and the phase of a signal fed from a programmable divider 12. The output signal of the phase detector 3 is low-pass filtered (loop filter 21), and the low-pass filtered voltage signal is then fed to the VCO 10. The output signal of the VCO 10 is, on the one hand, derived as the desired signal and, on the other hand, fed to the phase detector 3 and via a further programmable divider 12. The divider values of the programmable dividers 2 and 12 can be driven by a microprocessor 14.

The divider values of the programmable dividers 2 and 12 are changed by varying the control value of the microprocessor 14. After each frequency change, the control loop must then resettle and finally lock. This settling time constant is codetermined, for example, by the delay time (time constant) of the low-pass loop filter 21. It may be stated as a rule of thumb that the settling time of the closed loop for "locking" onto a new frequency lasts approximately 100 periods of the divided reference frequency fed to the phase detector 3. This works out to, for example, 0.1 s in the case of a frequency of 1 kHz.

However, in the case of receiving systems with PLL synthesizers it is important, inter alia, to carry out the frequency change as quickly as possible and at the same time to achieve as large as possible a signal-to-noise ratio (S/N) in the receive state, that is to say in the case of a fixed frequency. Both conditions, specifically a quick frequency change and large signal-to-noise ratio cannot normally be achieved with the aid of a single loop filter or, to put it generally, with the aid of a single time constant of the PLL loop. It is therefore known to provide low-pass loop filters with different time constants, for example by using a switching unit to select low pass filters with different time constants in a parallel-connected fashion. A problem in this case is that each change of the time constant can then be heard in the audio receiving system, since equipotential bonding takes place during switching over. Because of the smaller time constant, the time advantage gained is then generally nullified again by mute measures which necessarily follow.

U.S. Pat. No. 5,420,545 exhibits a frequency synthesizer which includes in the feedback path a programmable divider whose divider factor can be varied via a control circuit as a function of the desired output frequency. Moreover, in the case of frequency change the bandwidth of the loop filter is increased in order to permit a quicker settling to the new frequency. The control device is caused to do this by a frequency change signal. EP-A2-0 669 722 exhibits a similar phase-locked loop in which the time constant of the loop filter is varied in the case of a change in the frequency divider ratio. The loop filter includes a circuit with a variable resistor. The time constant of the loop filter is reduced so that locking of the PLL after a frequency change is accelerated. In the case of another phase-lock loop exhibited in EP-A2-0 211 594, two loop filters are provided which are switched selectively as a function of a change in the frequency divider ratio.

EP-A1-0 582 390 exhibits a phase-locked loop in which a changeover is made between two different loop filters as a function of the phase error provided by the phase comparator. In the case of a low phase error, the loop filter with a small bandwidth is activated, and in the case of a larger phase error the loop filter with a large bandwidth is activated.

Further possibilities are known for accelerating the frequency change. Thus, for example, the current of the charge pump in the PLL loop can be markedly increased, or the loop amplifier can be operated with a larger current.

Because of the problem, addressed above, of equipotential bonding during the switchover of time constants in the case of the loop filter, the prior art is frequently restricted to only increasing the current of the charge pumps for the frequency change operation. This is impossible without noise in the settled state of the PLL. Consequently, the circuit is mostly optimized such that in the case of the maximum achievable S/N the settling time achieved is simply accepted, and further optimization is possible only to the detriment of the S/N.

SUMMARY OF THE INVENTION

It is an object of the present invention to provide a technique for PLL synthesizers which improves the frequency change with regard to the changeover into the frequency change operating mode and the switching back into the receive operating mode.

Thus, according to the invention a method is proposed for operating a PLL synthesizer circuit. As is known from the prior art, the output frequency of the PLL synthesizer circuit can be selected by appropriately driving a programmable divider circuit in a feedback loop of the PLL synthesizer circuit. The PLL synthesizer circuit of the present invention can be operated in a receive operating mode (fixed frequency) and at least one further operating mode (frequency change mode). In the frequency change mode, the PLL synthesizer circuit has a settling time constant which is reduced by comparison with that of the receive operating mode, with the result that the frequency change can be performed comparatively swiftly. The PLL synthesizer circuit is changed over in this case into the frequency change mode (that is to say that frequency change operating mode with a small settling time constant) as a function of a detection that the programmable divider circuit is being driven with a changed value. If, specifically, a frequency change is carried out by appropriately driving the programmable divider circuit, the closed loop is taken out of its settled state, and the phase difference grows without restriction, as it were. In this state, reception is impossible in any event, with the result that it is also possible, for example, to reduce the time constant of the low-pass filter, since it is not necessary to place any value on a large signal-to-noise ratio in the case of the frequency change. It is then possible to switch back into the receive operating mode as soon as the phase difference between the output signal of the programmable divider circuit and a reference frequency undershoots a prescribed threshold value. Thus, switching back into the receive operating mode is started at a different point in the PLL loop than is the triggering of the frequency change mode.

The changeover into the frequency change operating mode is not triggered in the present invention by detecting the overshooting of a predetermined limiting value by the phase difference. Specifically, the phase difference can also overshoot the predetermined limiting value without an undesired frequency change owing to disturbing influences on the PLL loop. The result in this case would be to initiate the frequency change mode unnecessarily. The frequency change mode is initiated in the present invention only when the aim is actually to carry out a frequency change by appropriate driving of the programmable divider.

If the change into the frequency change mode has been initiated, at least one of the following can be executed:
the current of a charge pump of the PLL synthesizer circuit can be increased,
the current of a loop amplifier of the PLL synthesizer circuit can be increased,
the time constant of a loop filter of the PLL synthesizer circuit can be reduced, and/or
the programmable divider circuit and a programmable reference divider circuit between a reference oscillator and a phase detector of the PLL synthesizer circuit can each be driven to a higher frequency, as a result of which the phase detector is fed signals of raised frequency.

As mentioned above, the settling time of the PLL loop up to locking depends, inter alia, on the frequencies fed to the phase detector. It is therefore possible to reduce the settling time by increasing these frequencies.

According to the invention, a PLL synthesizer circuit is further provided. This PLL synthesizer circuit has a programmable divider circuit which is driven by a controller for the purpose of selecting a desired output frequency of the PLL synthesizer circuit. An operating mode selector circuit optionally drives a receive operating mode and at least one further operating mode (frequency change operating mode) of the PLL synthesizer circuit, the PLL synthesizer circuit having in the frequency change operating mode a settling time constant which is reduced by comparison with the receive operating mode.

Means are provided for detecting the driving of the programmable divider circuit by the controller with the aid of a changed driver value, which means output a detection signal to the operating mode selector circuit, which signal causes the latter to drive the frequency change operating mode.

A phase detector and an interlocking detector are provided, in which case the interlocking detector compares the output signal of the phase detector with a threshold value, and in the case when the output signal of the phase detector undershoots the threshold value, outputs an interlocking signal to the operating mode selector circuit which causes the latter to drive the receive operating mode.

In order to reduce the settling time constant of the PLL synthesizer circuit in the frequency change operating mode, it is possible to provide a charge pump whose current can be increased in the frequency change operating mode.

Alternatively or in addition, the current with which a loop amplifier is operated can be increased in the frequency change operating mode.

Alternatively or in addition, a loop filter with a selectable time constant can be provided, with the time constant being reduced in the frequency change operating mode.

Alternatively or in addition, in order to reduce the settling time constant of the PLL synthesizer circuit in the frequency change operating mode, it is possible to provide a programmable reference divider circuit between a reference oscillator and a phase detector of the PLL synthesizer circuit which is driven in each case to a higher frequency in the frequency change operating mode by the operating mode selector circuit together with the programmable divider circuit.

It is possible to provide two parallel loop filters with different time constants, a switch selecting the loop filter with the larger time constant in the receive mode.

A high-resistance resistor can be connected between the two loop filters for the purpose of equipotential bonding. It is possible in this way to avoid the problem of "clicking", that is to say the audible equipotential bonding in the case of audio receiving systems.

Alternatively, for the purpose of changing the time constant of a loop filter it is possible to connect a resistor in parallel with a loop filter by means of a switching unit. Consequently, in this case the switching unit is not a changeover switch—rather, the parallel-connected resistor is only switched on or off. In this case, as well, the problem of; equipotential bonding which can lead to an audible clicking noise is eliminated.

BRIEF DESCRIPTION OF THE DRAWINGS

Embodiments of the invention will now be described by way of example with reference to the drawings in which.

DETAILED DESCRIPTION OF THE INVENTION

Figure 1:
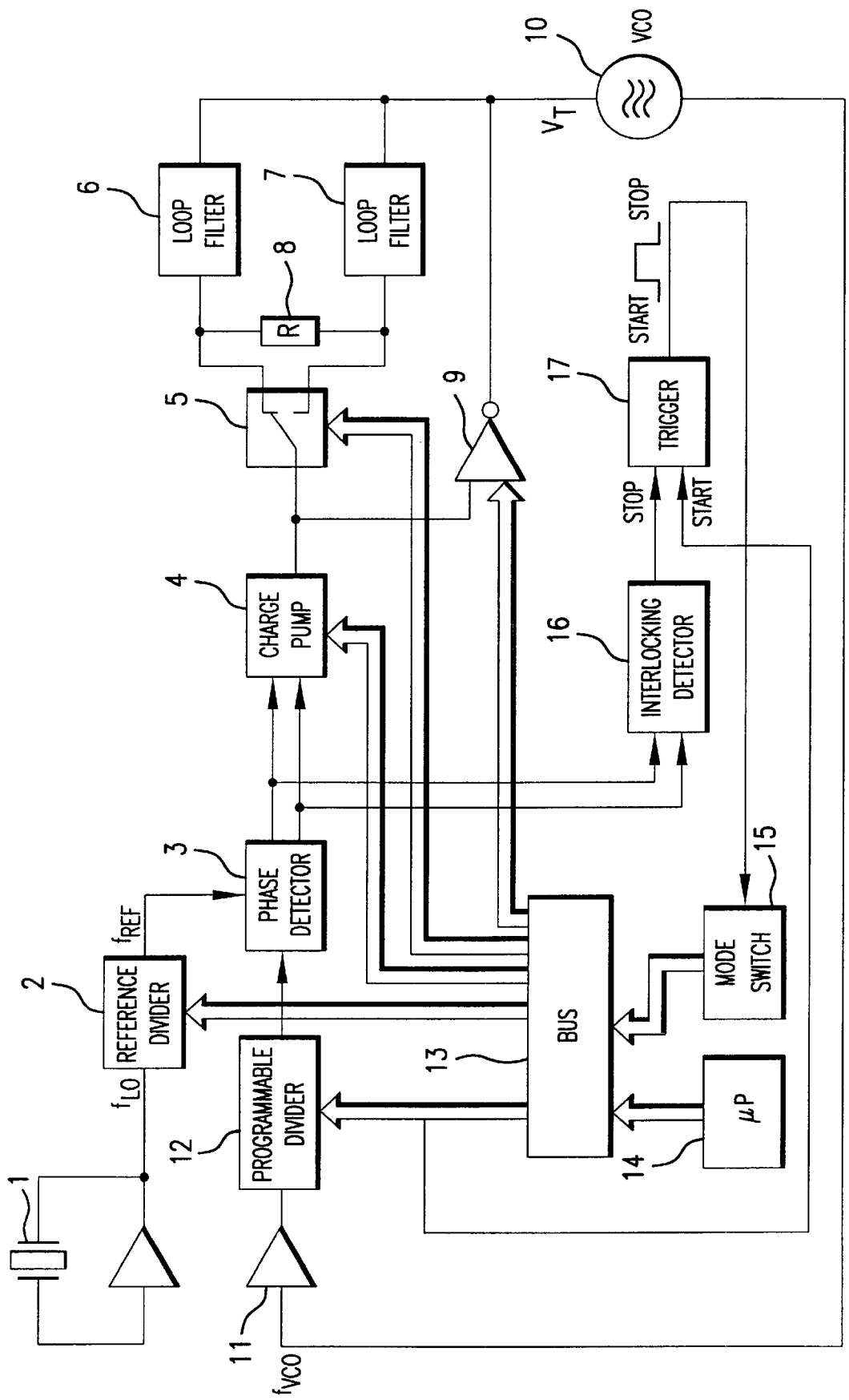
FIG. 1 shows a PLL synthesizer circuit in accordance with an exemplary embodiment of the present invention.

With reference to FIG. 1, the aim is first to explain the PLL synthesizer circuit according to the invention. A local oscillator frequency $f_{Lo}$ is fed to a reference divider 2 from a quartz crystal 1. Reference divider 2 is a programmable divider, it being possible, for example, to perform the programming via a bus 13 starting from a microprocessor 14.

The divided output frequency $f_{REF}$ of the reference divider 2 is fed to the phase detector 3. The output signal of the phase detector 3 is fed to a charge pump 4. The charge pump (current source/sink) gives an output signal to a low-pass loop filter unit which has at least two different loop filters 6, 7. A switching unit 5, which is likewise driven by means of the bus 13, can be used to select whether the loop filter 6 with the smaller time constant $\tau_1$, or the loop filter 7 with the larger time constant $\tau_2$ is to be connected. A resistor 8 is connected on the input side between the loop filters 6, 7 for the purpose of equipotential bonding and of avoiding audible clicking noises during the changeover operation.

Also provided is a loop amplifier 9 which is necessary, inter alia, to convert the voltage range of, for example, 0.5 to 4.5 V of the charge pump 4 to the higher voltage range of, for example, 0 to 7 V, which is required, for example, by a VCO 10 for VHF applications.

The current through the charge pump 4, and the current with which the loop amplifier 9 is operated, can likewise be selected by means of the bus 13, in a fashion controlled, for example, by the microprocessor 14.

The signal with the frequency $f_{VCO}$ produced by the VCO 10 as a function of the tuning voltage $V_T$ is, if necessary, amplified again by an amplifier 11 and then fed to a programmable divider 12. The signal divided by the programmable divider 12 is fed to the phase detector 3, which compares the phase of this signal with the phase of the signal from the reference divider 2.

The divider value of the reference divider 2, and the divider value of the loop divider 12 can likewise be selected by means of the bus 13, for example in a fashion driven by the microprocessor 14. The microprocessor 14 uses the bus 13 to drive the divider circuits 2 and 12, for example in the case of a frequency change.

As set forth previously, an aim of the present invention is to reduce the settling time constant of the PLL synthesizer circuit for the case of a frequency change which is initiated by the microprocessor 14. Various measures, which are explained later, can be taken for this purpose.

We now set forth how the frequency change mode with a reduced settling time is initiated in accordance with the present invention. As already mentioned, for the purpose of a frequency change the microprocessor 14 uses the bus 13 to drive the loop divider 12 with a new driver value. This changed drive value is detected by a trigger 17 which in the case of this detection of a new drive value for the loop divider 12 gives a start signal to a mode changeover switch 15. The mode changeover switch 15, which can therefore switch to and fro between the frequency change operating mode and the receive operating mode, then outputs appropriate changeover signals via the bus 13 to various components of the PLL synthesizer circuit.

For the purpose of changing back from the frequency change operating mode into the receive operating mode, an interlocking detector 16 detects the phase difference which is output by the phase detector 3. As soon as this phase difference has fallen below a prescribed threshold value again, and the PLL synthesizer circuit as a whole has resettled, the interlocking detector 16 gives a stop signal to the trigger 17, which gives a corresponding output signal, that is to say an interlocking detection signal, to the mode switch 15 which can then use the bus 13 to change over the various components of the PLL synthesizer circuit once again to parameters for the receive operating mode.

There are a number of advantages in triggering the change into the frequency change mode by detecting a changed drive of the loop divider 12. On the one hand, a changed drive of the loop divider 12 is an unambiguous indication of a desired frequency change. Moreover, the change into the frequency change mode becomes independent of phase errors, occurring from malfunctions, for example, at the output of the phase detector 3, the system as a whole thereby becoming more stable.

The operating mode switch 15 can also use the bus 13 to change the parameters of various components of the synthesizer circuit as a whole or only partly, thus also enabling various frequency change modes (fast modes) in addition to the receive (standard) mode.

The following parameter changes in the PLL synthesizer circuit are possible in principle for changing into the frequency change mode (fast mode):

As already set forth, the switching unit 5 can perform a changeover from the loop filter 7 with a large time constant $\tau_2$ to the loop filter 6 with a small time constant $\tau_1$. Although there is a simultaneous worsening of the signal-to-noise ratio, this plays no role during the frequency change mode.

Furthermore, in the frequency change mode the current used to operate the loop amplifier 9 can be increased. Again, the current through the charge pump 4 can also be increased. Finally, the divider circuits 2 and 12 can be driven towards a smaller divider value (triggered by the mode switch 15), with the result that signals with higher frequencies are fed to the phase detector 3.

Figure 2:
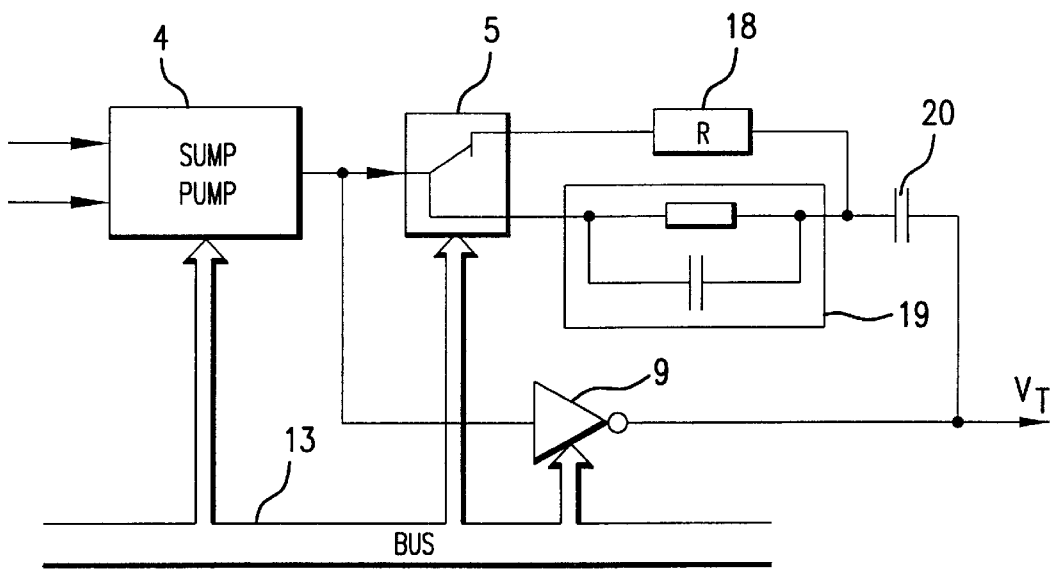
FIG. 2 shows a section of the PLL synthesizer circuit of FIG. 1 in accordance with a further exemplary embodiment.
Figure 3:
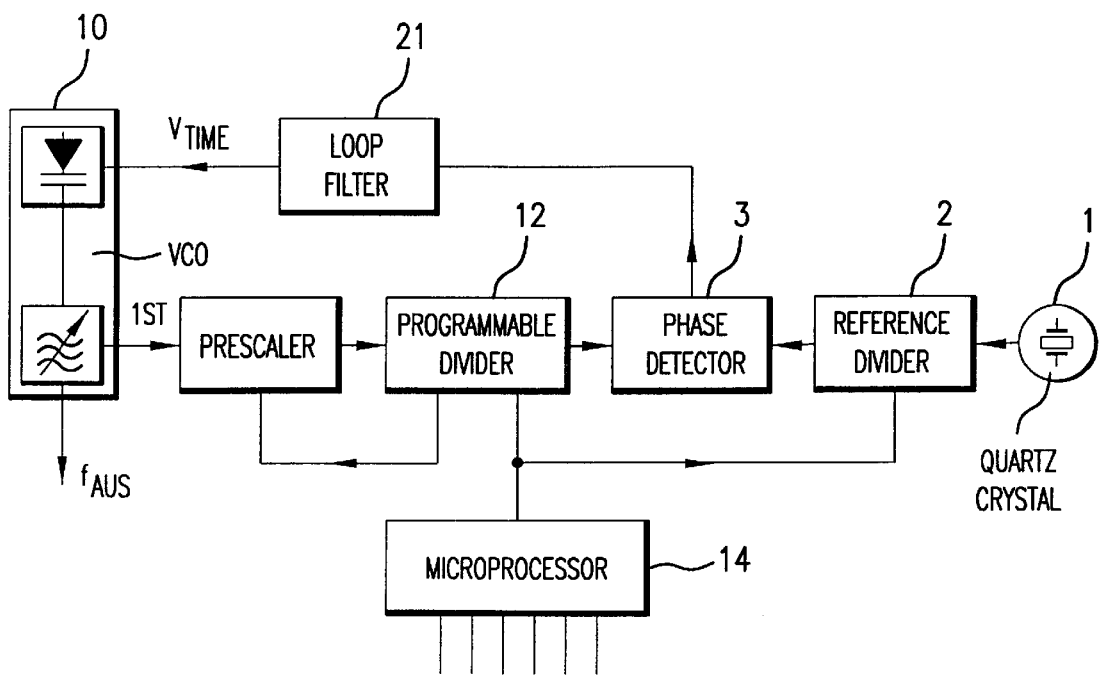
FIG. 3 shows a PLL synthesizer circuit in accordance with the prior art.

FIG. 2 shows a section of a PLL synthesizer circuit in accordance with a further exemplary embodiment of the invention. This exemplary embodiment has differences from the exemplary embodiment of FIG. 1 in the region of the loop filters. As may be seen in FIG. 2, one loop filter 19, 20 is always active in accordance with this exemplary embodiment. Only this loop filter 19, 20 is active in the frequency change mode. In the case of the receive mode, the switching unit 5 is triggered by a signal from the bus 13 to connect a resistor 18 in parallel with the loop filter 19, 20, with the result that the damping, and thus also the time constant, of the loop filter are increased overall. The signal-to-noise ratio is thereby also improved with the acceptance of a loss in speed, and this is, of course, desired in the receive state.

Just as is illustrated by the resistor in accordance with the exemplary embodiment of FIG. 1, the exemplary embodiment of FIG. 2 illustrates that the potential respectively applied between the two branches of the loop filter is transmitted, and therefore balanced. This permits changeover without interference.

Of course, by appropriate provision of loop filters two or more time constants can be connected in a fashion capable of changeover to a single charge pump and to the same output of the loop amplifier. This yields a minimum external outlay on circuitry. The operating state (receive state) in which a maximum signal-to-noise ratio is required, and the settling time in the case of the frequency change mode can be optimized separately from one another and independently. The optimum conditions at the output of the charge pump (preferably $V_{DD}/2$) are maintained when the loop amplifier current is changed over for the purpose of shortening the settling time.

The integrated loop amplifier can optionally be set via the controllable current source (charge pump) such that in combination with the currents of the charge pump and a selected loop filter a maximum signal-to-noise ratio and a minimum settling time of the PLL synthesizer circuit are achieved. The two states can be optimized individually in each case.

Fields of application for the PLL synthesizer circuit of the present invention include at least automotive radios, TV sets and mobile radio applications.

The German Priority Application No. 19930225.1 is relied upon and hereby incorporated by reference in its entirety.

Various preferred embodiments of the invention have now been described. While these embodiments have been set forth by way of example, various other embodiments and modifications will be apparent to those skilled in the art. Accordingly, it should be understood that the invention is not limited to such embodiments, but encompasses all that which is described in the following claims.

What is claimed is:

1. A PLL synthesizer circuit comprising:
a programmable divider circuit driven by a controller for selecting a desired output frequency of the PLL synthesizer circuit;
an operating mode selector circuit which optionally drives a receive operating mode of the PLL synthesizer circuit having a third settling time constant and at least one further operating mode having a fourth settling time constant reduced with respect to the third settling time constant; and
a trigger for detecting the driving of the programmable divider circuit by the controller with the aid of a changed drive value which outputs a detection signal to the operating mode selector circuit causing the operating mode selector to drive the at least one further operating mode, wherein a phase detector and an interlocking detector compare an output signal of the phase detector with a threshold value and output an interlocking signal to the operating mode selector circuit causing the operating mode selector circuit to drive the receive operating mode when the output signal of the phase detector undershoots the threshold value.

2. The PLL synthesizer circuit as claimed in claim 1, wherein for the purpose of reducing the fourth settling time constant a charge pump is provided whose current is increased in the at least one further operating mode.

3. The PLL synthesizer circuit as claimed in claim 1, wherein for the purpose of reducing the fourth settling time constant a loop amplifier is provided whose current is increased in the at least one further operating mode.

4. The PLL synthesizer circuit as claimed in claim 1, wherein for the purpose of reducing the fourth settling time constant a loop with a selectable time constant is provided whose time constant is reduced in the at least one further operating mode.

5. The PLL synthesizer circuit as claimed in claim 1, wherein for the purpose of reducing the fourth settling time constant a programmable reference divider circuit is provided which is connected between a reference oscillator and the phase detector and which is driven to a higher frequency in the at least one further operating mode by the operating mode selector circuit together with the programmable divider circuit.

6. The PLL synthesizer circuit as claimed in claim 1, wherein two parallel loop filters with different time constants are provided, wherein a switch selects the loop filter with a larger time constant in the receive mode.

7. The PLL synthesizer circuit as claimed in claim 6, wherein a high-resistance resistor is connected between the two loop filters.

8. The PLL synthesizer circuit as claimed in claim 1, wherein for the purpose of changing a time constant of a loop filter a resistor is connected in parallel with the loop filter using a switch.

9. A PLL synthesizer circuit, comprising:
a programmable divider circuit driven by a first driving signal from a controller for selecting a desired output frequency of the PLL synthesizer circuit;
an operating mode selector circuit which optionally drives a receive operating mode of the PLL synthesizer circuit characterized by a third settling time constant and at least one further operating mode characterized by a fourth settling time reduced with respect to the third settling time constant;
a trigger for detecting a second driving signal from the controller for driving the programmable divider circuit, which outputs a detection signal to the operating mode selector circuit to cause the operating mode selector circuit to drive the at least one further operating mode, wherein a phase detector and an interlocking detector compare an output signal from the phase detector with a threshold value and output an interlocking signal to the operating mode selector circuit to cause the operating mode selector circuit to drive the receive operating mode when the output signal of the phase detector undershoots the threshold value.

10. The PLL synthesizer circuit according to claim 9, further comprising a programmable reference divider circuit connected between a reference oscillator and the phase detector and driven to a higher frequency in the at least one further operating mode by the operating mode selector circuit together with the programmable divider circuit, for the purpose of reducing the fourth settling time constant.

11. The PLL synthesizer circuit according to claim 9, further comprising a loop filter with an adjustable time constant and a resistor connected in parallel with the loop filter through a switch, for the purpose of varying the adjustable time constant.

12. A method of operating a PLL synthesizer circuit, comprising:
driving a programmable divider circuit driven by a controller for selecting a desired output frequency of the PLL synthesizer circuit;
operating an operating mode selector circuit which optionally drives a receive operating mode of the PLL synthesizer circuit having a third settling time constant and at least one further operating mode having a fourth settling time constant reduced with respect to the third settling time constant; and
detecting, with a trigger, the driving of the programmable divider circuit by the controller with the aid of a changed drive value which outputs a detection signal to the operating mode selector circuit causing the operating mode selector to drive the at least one further operating mode, wherein a phase detector and an interlocking detector compare an output signal of the phase detector with a threshold value and output an interlocking signal to the operating mode selector circuit causing the operating mode selector circuit to drive the receive operating mode when the output signal of the phase detector undershoots the threshold value.

13. The method as claimed in claim 12, further comprising reducing the fourth settling time constant by providing a charge pump whose current is increased in the at least one further operating mode.

14. The method as claimed in claim 12, further comprising reducing the fourth settling time constant by providing a loop amplifier whose current is increased in the at least one further operating mode.

15. The method as claimed in claim 12, further comprising reducing the fourth settling time constant, by providing a loop with a selectable time constant whose time constant is reduced in the at least one further operating mode.

16. The method as claimed in claim 12, further comprising reducing the fourth settling time constant by driving a programmable reference divider circuit connected between a reference oscillator and the phase detector to a higher frequency in the at least one further operating mode by the operating mode selector circuit together with the programmable divider circuit.

17. The method as claimed in claim 12, further comprising providing two parallel loop filters with different time constants, wherein a switch selects the loop filter with a larger time constant in the receive mode.

18. The method as claimed in claim 17, further comprising connecting a high-resistance resistor between the two loop filters.

19. The method as claimed in claim 12, further comprising connecting a resistor in parallel with a loop filter, using a switch, thereby changing a time constant of the loop filter.

20. A method of operating a PLL synthesizer circuit, comprising:

driving a programmable divider circuit by a first driving signal from a controller for selecting a desired output frequency of the PLL synthesizer circuit;

operating an operating mode selector circuit which optionally drives a receive operating mode of the PLL synthesizer circuit characterized by a third settling time constant and at least one further operating mode characterized by a fourth settling time reduced with respect to the third settling time constant; and detecting, with a trigger, a second driving signal from the controller for driving the programmable divider circuit, which outputs a detection signal to the operating mode selector circuit to cause the operating mode selector circuit to drive the at least one further operating mode, wherein a phase detector and an interlocking detector compare an output signal from the phase detector with a threshold value and output an interlocking signal to the operating mode selector circuit to cause the operating mode selector circuit to drive the receive operating mode when the output signal of the phase detector undershoots the threshold value.

21. The method according to claim 20, further comprising reducing the fourth settling time constant by driving a programmable reference divider circuit connected between a reference oscillator and the phase detector to a higher frequency in the at least one further operating mode selector circuit together with the programmable divider circuit.

22. The method according to claim 20, further comprising varying an adjustable time constant of a loop filter where a resistor is connected in parallel with the loop filter through a switch.

* * * * *